(12) United States Patent
Thanu et al.

(10) Patent No.: US 10,643,938 B2
(45) Date of Patent: May 5, 2020

(54) STANDOFF SPACERS FOR MANAGING BONDLINE THICKNESS IN MICROELECTRONIC PACKAGES

(71) Applicant: Intel Corporation, Santa Clara, CA (US)

(72) Inventors: Dinesh P. R. Thanu, Chandler, AZ (US); Hemanth K. Dhavaleswarapu, Chandler, AZ (US); John J. Beatty, Chandler, AZ (US); Sachin Deshmukh, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/610,327

(22) Filed: May 31, 2017

(65) Prior Publication Data

US 2018/0350712 A1    Dec. 6, 2018

(51) Int. Cl.
| | | |
|---|---|---|
| *H01L 23/498* | (2006.01) | |
| *H01L 23/367* | (2006.01) | |
| *H01L 23/373* | (2006.01) | |
| *H01L 23/42* | (2006.01) | |

(52) U.S. Cl.
CPC .... *H01L 23/49838* (2013.01); *H01L 23/3675* (2013.01); *H01L 23/367* (2013.01); *H01L 23/3736* (2013.01); *H01L 23/42* (2013.01); *H01L 2224/16225* (2013.01); *H01L 2224/32225* (2013.01); *H01L 2224/73204* (2013.01); *H01L 2224/73253* (2013.01); *H01L 2924/15192* (2013.01); *H01L 2924/16152* (2013.01)

(58) Field of Classification Search
CPC ....................................................... H01L 23/36
See application file for complete search history.

(56) References Cited

U.S. PATENT DOCUMENTS

| | | | |
|---|---|---|---|
| 9,165,857 B2 | 10/2015 | Song et al. | |
| 9,686,888 B2 | 6/2017 | Song et al. | |
| 2004/0196634 A1* | 10/2004 | Mallik | H01L 23/36 361/704 |
| 2005/0174738 A1* | 8/2005 | Lam | H01L 23/36 361/704 |
| 2008/0017975 A1* | 1/2008 | Deppisch | H01L 23/42 257/706 |
| 2009/0108429 A1* | 4/2009 | Tsao | H01L 23/4006 257/686 |
| 2014/0126150 A1* | 5/2014 | Song | H01L 23/473 361/699 |

* cited by examiner

*Primary Examiner* — Jay C Chang
*Assistant Examiner* — Mikka Liu
(74) *Attorney, Agent, or Firm* — Green, Howard & Mughal LLP (57) ABSTRACT

A microelectronic package may be fabricated to include a microelectronic substrate, a plurality of microelectronic devices attached to the microelectronic substrate, a heat dissipation device in thermal contact with at least one of the plurality of microelectronic devices and attached to the microelectronic substrate, and at least one offset spacer attached between the microelectronic substrate and the heat dissipation device to control the bondline thickness between the heat dissipation device and at least one of the plurality of microelectronic devices.

22 Claims, 5 Drawing Sheets

STANDOFF SPACERS FOR MANAGING BONDLINE THICKNESS IN MICROELECTRONIC PACKAGES

TECHNICAL FIELD

Embodiments of the present description generally relate to the field of heat dissipation from a microelectronic device, and, more specifically, to a heat dissipation device which is attached to a microelectronic substrate for the removal of heat from one or more microelectronic devices.

BACKGROUND ART

The microelectronic industry is continually striving to produce ever faster and smaller microelectronic devices for use in various mobile electronic products. As these goals are achieved, the density of power consumption of components within the microelectronic devices has increased, which, in turn, increases the average junction temperature of the microelectronic device. If the temperature of the microelectronic device becomes too high, the integrated circuits within the microelectronic device may be damaged or destroyed. Thus, heat dissipation devices are used to remove heat from the microelectronic devices in a microelectronic package. In example, at least one microelectronic device may be mounted to a substrate and the heat dissipation device may be attached to the substrate and extend over the microelectronic device(s) to form the microelectronic package. The distance between the microelectronic device(s) and the heat dissipation device is known as the bondline thickness, and a thermal interface material is generally disposed between the microelectronic device(s) and the heat dissipation device to form thermal contact therebetween. In general, the thinnest bondline thicknesses maximize heat removal. However, multiple microelectronic devices being thermally managed by a single heat dissipation device may create various issues.

One issue is with increased heterogeneous integration of microelectronic devices, such as memory, transceivers, FPGA, and the like, higher communication is required, which is driving up the edge power densities and, thus, increases the heat generated, which also creates high thermal stress zones.

Another issue is high thermal degradation due to the increased thermal interface material stress which is, in turn, driven by high microelectronic package warpage.

A further issue with multiple microelectronic devices is that it is not generally predicable upon which microelectronic device the heat dissipation device will bottom out. This coupled with the variability in the direct device attach process may cause deformation of the microelectronic package also leading to unpredictable bondlines. This may lead to unpredictable thermal performance and may also lead to degradation of the thermal interface material.

Still a further issue is that multiple microelectronic devices can cause increased device-to-package center offsets causing device tilt that can lead to sealant delamination and microelectronic device cracking, as will be understood to those skilled in the art.

Thus, there is a need to develop heat dissipation device configurations to address the various issues with regard to multiple microelectronic devices.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description relate to a microelectronic package fabricated to include a microelectronic substrate, a plurality of microelectronic devices attached to the microelectronic substrate, a heat dissipation device in thermal contact with at least one of the plurality of microelectronic devices and attached to the microelectronic substrate, and at least one offset spacer attached between the microelectronic substrate and the heat dissipation device to control the bondline thickness between the heat dissipation device and at least one of the plurality of microelectronic devices.

Figure 1:
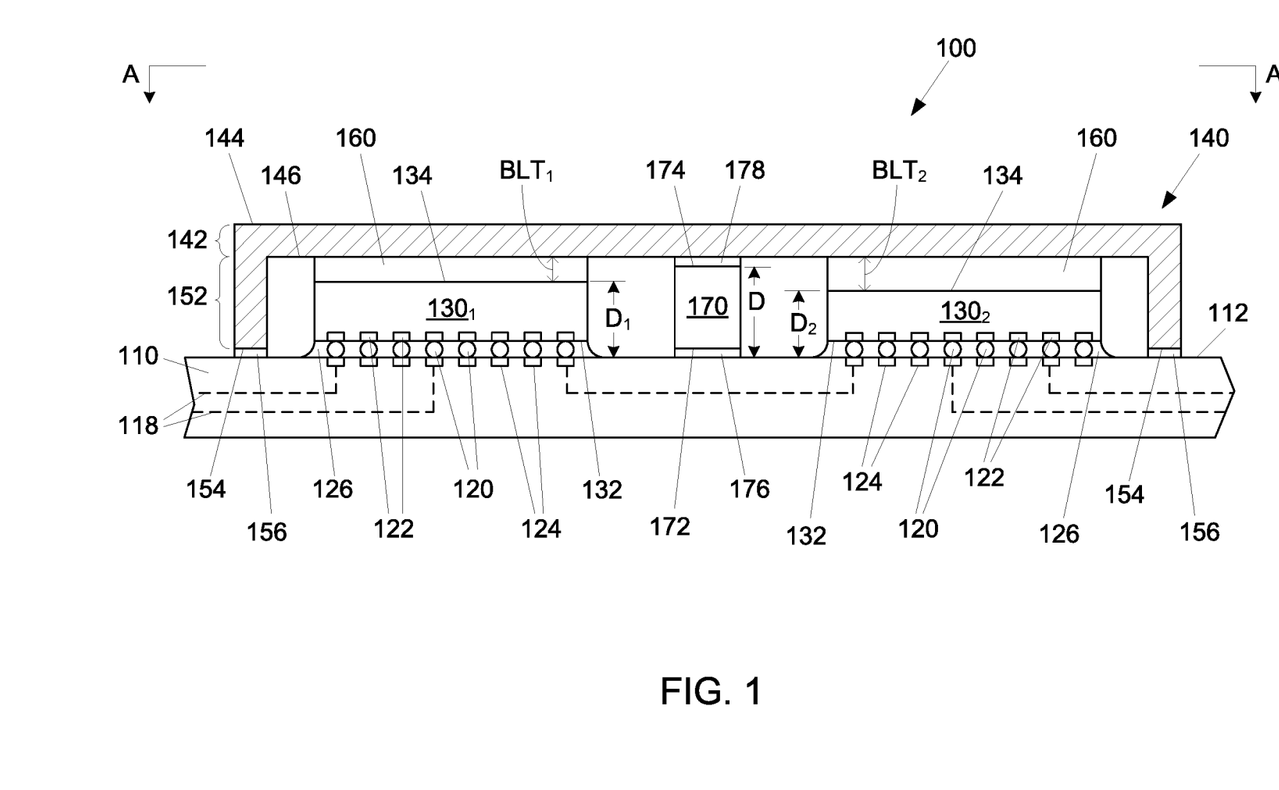
FIG. 1 illustrates a side cross-sectional view of a microelectronic package including microelectronic devices attached to the microelectronic substrate with a heat dissipation device attached to the microelectronic substrate spanning the microelectronic devices, wherein an offset spacer is positioned between the heat dissipation device and the microelectronic substrate, according to one embodiment of the present description.

As shown in FIG. 1, a microelectronic package 100 may be formed by first providing or forming a microelectronic substrate 110, such as a printed circuit board, motherboard, or the like. At least one microelectronic device (shown as a first microelectronic device $130_1$ and a second microelectronic device $130_2$), such as a microprocessor, a multichip package, a chipset, a graphics device, a wireless device, a memory device, an application specific integrated circuit device, and the like, may be attached to a first surface 112 of the microelectronic substrate 110 with a plurality of interconnects 120. The device-to-substrate interconnects 120, such as soldered interconnects, may extend between bond pads 122 formed in or on an active surface 132 of each of the microelectronic devices $130_1$ and $130_2$, and substantially mirror-image bond pads 124 in or on the microelectronic substrate first surface 112. An underfill material 126, such as an epoxy material, may be disposed between the microelectronic device active surface 132 and the microelectronic substrate first surface 112, and surrounding the device-to-substrate interconnects 120. As will be understood to those skilled in the art, the underfill material 126 may be dispensed between the microelectronic device active surfaces 132 and the microelectronic substrate first surface 112 as a viscosity liquid and then hardened with a curing process. The underfill material 126 may also be a molded underfill material, as known in the art. The underfill material 126 may provide structural integrity and may prevent contamination, as will be understood those skilled in the art.

As further shown in FIG. 1, the microelectronic substrate 110 may provide electrical communication routes (illustrated as dashed lines 118) between the microelectronic devices $130_1$ and $130_2$, and external components (not shown). As will be understood to those skilled in the art, the microelectronic device bond pads 122 may be in electrical communication with integrated circuitry (not shown) within each of the microelectronic devices $130_1$ and $130_2$.

As yet further shown in FIG. 1, a heat dissipation device 140 may be attached to the microelectronic substrate 110. The heat dissipation device 140 may include a planar portion 142 having a first surface 144 and an opposing second surface 146, and may have at least one projection 152 extending from the planar portion second surface 146. The heat dissipation device projection(s) 152 may be attached to the microelectronic substrate first surface 112 such that the planar portion second surface 146 spans, but does not necessarily directly contact back surfaces 134 (opposing each of the microelectronic device active surfaces 132) of each of the microelectronic devices $130_1$ and $130_2$, and a thermal interface material 160 may be disposed between the planar portion second surface 146 of the heat dissipation device 140 and the back surfaces 134 of each of the microelectronic devices $130_1$ and $130_2$. The heat dissipation device projection(s) 152 may be attached to the microelectronic substrate 110 by any appropriate means, including but not limited to a sealant material 156, such as an epoxy, disposed between an attachment surface 154 of the heat dissipation device projection(s) 152 and the microelectronic substrate first surface 112. In one embodiment, the heat dissipation device projection(s) 152 extend substantially perpendicular to the planar portion second surface 146 of the heat dissipation device 140.

The heat dissipation device 140 may be formed from any appropriate thermally conductive material, including, but not limited to copper, aluminum, and the like. In one embodiment, the heat dissipation device 140 may be formed from a molding or a stamping process, such that the heat dissipation device 140 is a single continuous material. In another embodiment, the planar portion 142 of the heat dissipation device 140 may be formed separately from the projection(s) 152 of heat dissipation device 140 and attached together.

As shown in FIG. 1, the microelectronic package 100 may further include at least one offset spacer 170 positioned between the microelectronic substrate first surface 112 and the planar portion second surface 146 of the heat dissipation device 140. As illustrated, the offset spacer(s) 170 may include a first attachment surface 172 and an opposing second attachment surface 174. The offset spacer(s) 170 may be attached to the microelectronic substrate 110 with a first adhesive material 176, such as solder or epoxy, disposed between the offset spacer first attachment surface 172 and the microelectronic substrate first surface 112, and may be attached to the heat dissipation device 140 with a second adhesive material 178, such as an epoxy, disposed between the offset spacer second attachment surface 174 and the planar portion second surface 146 of the heat dissipation device 140. In one embodiment, a distance D from the microelectronic substrate first surface 112 and the offset spacer second attachment surface 174 may be greater than distances from microelectronic substrate first surface 112 and the back surfaces 114 of the microelectronic devices (illustrated as distance $D_1$ for the first microelectronic device $130_1$ and as distance $D_2$ for the second microelectronic device $130_2$). Thus, the planar portion second surface 146 of the heat dissipation device 140 may bottom out on the offset spacer(s) 170 rather than on any of the microelectronic devices $130_1$ and $130_2$. This may allow for thicker and controlled bondline thicknesses for the microelectronic devices, illustrated as a first bondline thickness $BLT_1$ for the first microelectronic device $130_1$ and a second bondline thickness $BLT_2$ for the second microelectronic device $130_2$. As will be understood to those skilled in the art, thicker and controlled bondline thicknesses, such as bondline thicknesses $BLT_1$ and $BLT_2$, can lead to lower stress for the thermal interface material 160, and thereby lower degradation thereof.

The offset spacer 170 may be made of any substantially rigid material, including but not limited to stainless steel, aluminum, copper, ceramics, and the like. As will be understood to those skilled in the art, that the offset space 170 may be attached to the microelectronic substrate 110 by a substrate supplier or as part of the microelectronic device attachment process.

Figure 2:
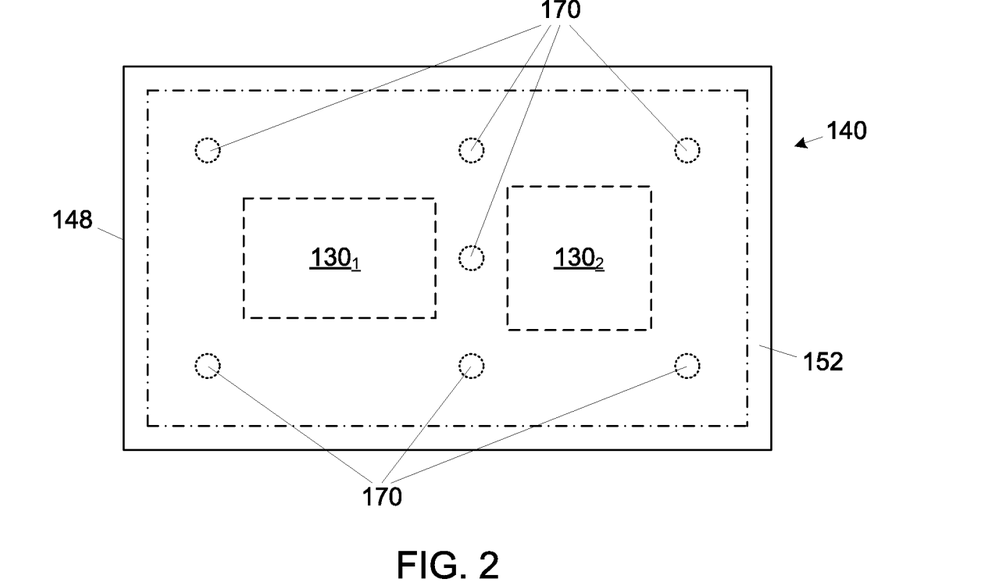
FIGS. 2-5 illustrate top plan views along line A-A of FIG. 1 showing various configurations of offset spacers within a microelectronic structure, according to various embodiments of the present description.
Figure 3:
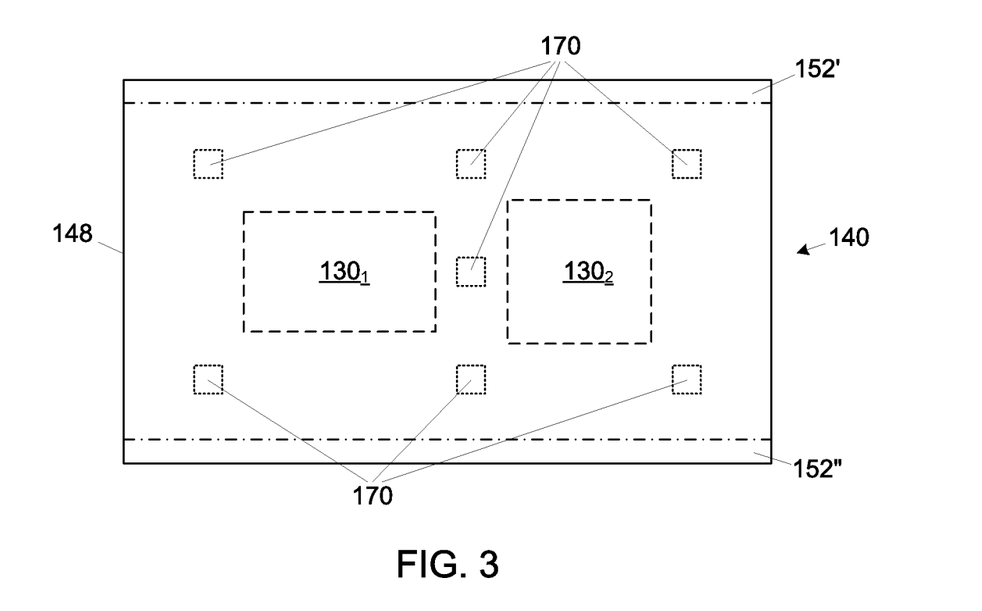
Figure 4:
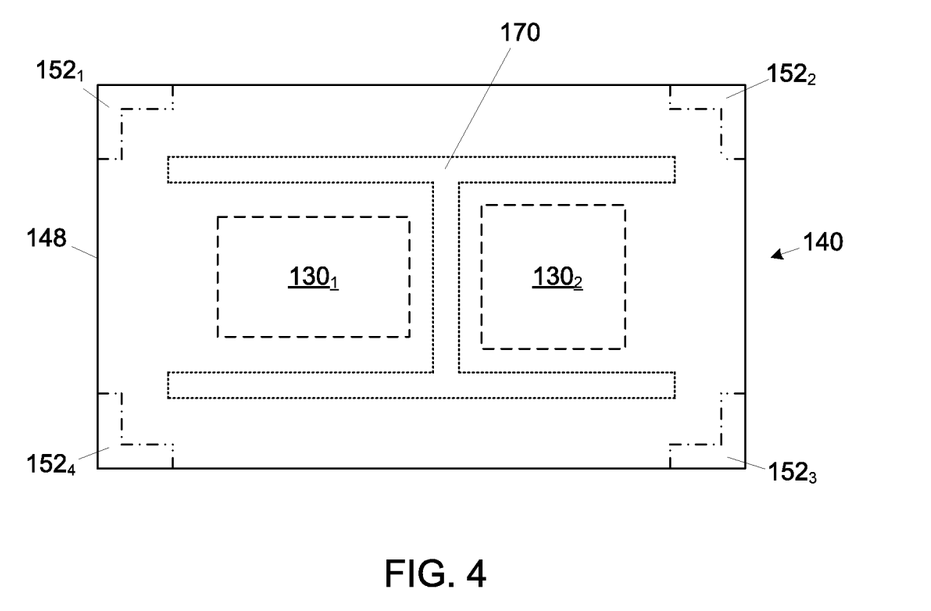

FIGS. 2-4 illustrate top plan views of various embodiment of the present description along line A-A of FIG. 1. The projection(s) 152 of the heat dissipation device 140 may be position at a periphery 148 of the heat dissipation device 140 and may have any appropriate shape and design, including, but not limited to, a single projection 152 (shown in dot-dash shadow lines in FIG. 2 and FIG. 5) which would surround the microelectronic devices $130_1$ and $130_2$ (shown in dashed shadow lines in FIG. 2 to illustrate a relative position thereof), two opposing wall projections (illustrated as elements 152' and 152" in FIG. 3 in dot-dash shadow lines), and projections forming L-shaped corners of the heat dissipation device 140 (illustrated as elements $152_1$, $152_2$, $152_3$, and $152_4$ in FIG. 4 in dot-dash shadow lines).

Figure 5:
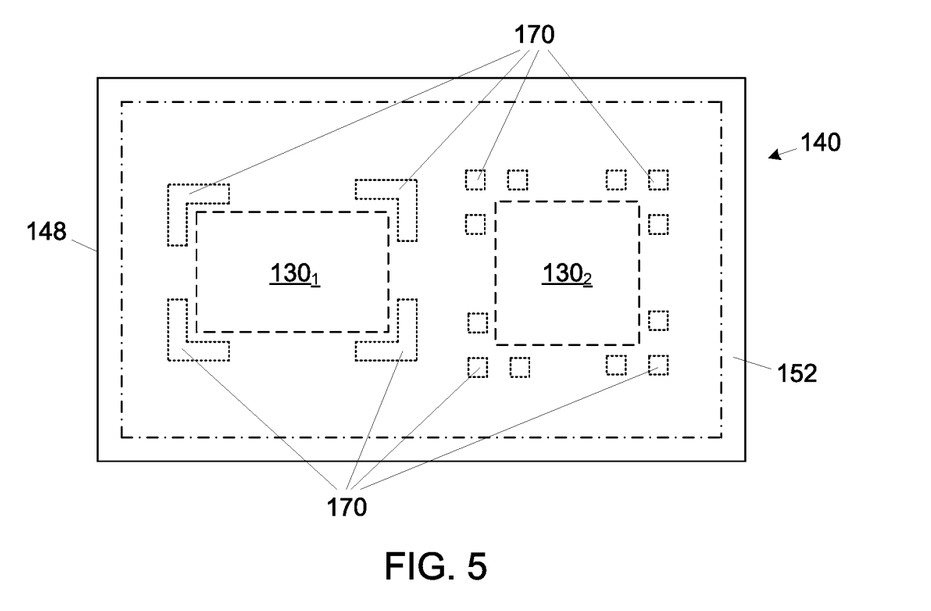

The standoff spacer(s) 170 can have any appropriate shape and may be placed within the periphery 148 of the heat dissipation device 140. For example, as shown in FIG. 2, the standoff space(s) 170 can be a column having any appropriate cross-section, including, but limited to triangular, circular, square, rectangular, or to the like (illustrated as circular in short dash shadow lines in FIG. 2 and square in short dash shadow lines in FIG. 5) and can be used to set any prescribed alignment required for the package. Furthermore, the standoff spacer(s) 170 can also take the form of a load bearing frame, as such walls or frame structures. For example, as shown in FIG. 4, the standoff spacer(s) 170 may be an H-frame, or as shown in FIG. 5, the standoff spacer(s) 170 may be L-shaped walls. As also shown in FIG. 5, the standoff spacer(s) 170 may be a mixture of wall structures (proximate the first microelectronic device $130_1$) and column structures (proximate the second microelectronic device $130_2$). Such wall-like or frame-like structures, may be designed to act as a stiffener for the microelectronic package 100 (see FIG. 1), to act as stops for the underfill material 126 (see FIG. 1), to lessen dynamic warpage of the microelectronic package 100 (see FIG. 1), and/or to improve the reliability of the interconnects 120 (see FIG. 1). It is understood that the embodiments illustrated in FIGS. 2, 3, 4, and 5 are merely exemplary and that the heat dissipation device projection(s) 152 and the spacing projection(s) 172 may have any appropriate shape and configuration.

As will be understood to those skilled in the art, the standoff spacer(s) 170 can be used as part of the design rules for attachment of the heat dissipation lip 140 to reduce "device-to-bond head offset" and, correspondingly, substantially eliminate device tilt, sealant delamination, and device crack risks, as previously discussed. Furthermore, the standoff spacer(s) 170 can be used at specific locations to reduce "device-to-sealant overhang", which correspondingly reduces stress and thermal degradation of the thermal interface material 160. Similarly, stresses in the microelectronic package 100 can be reduced by appropriate placement the standoff spacer(s) 170.

Figure 6:
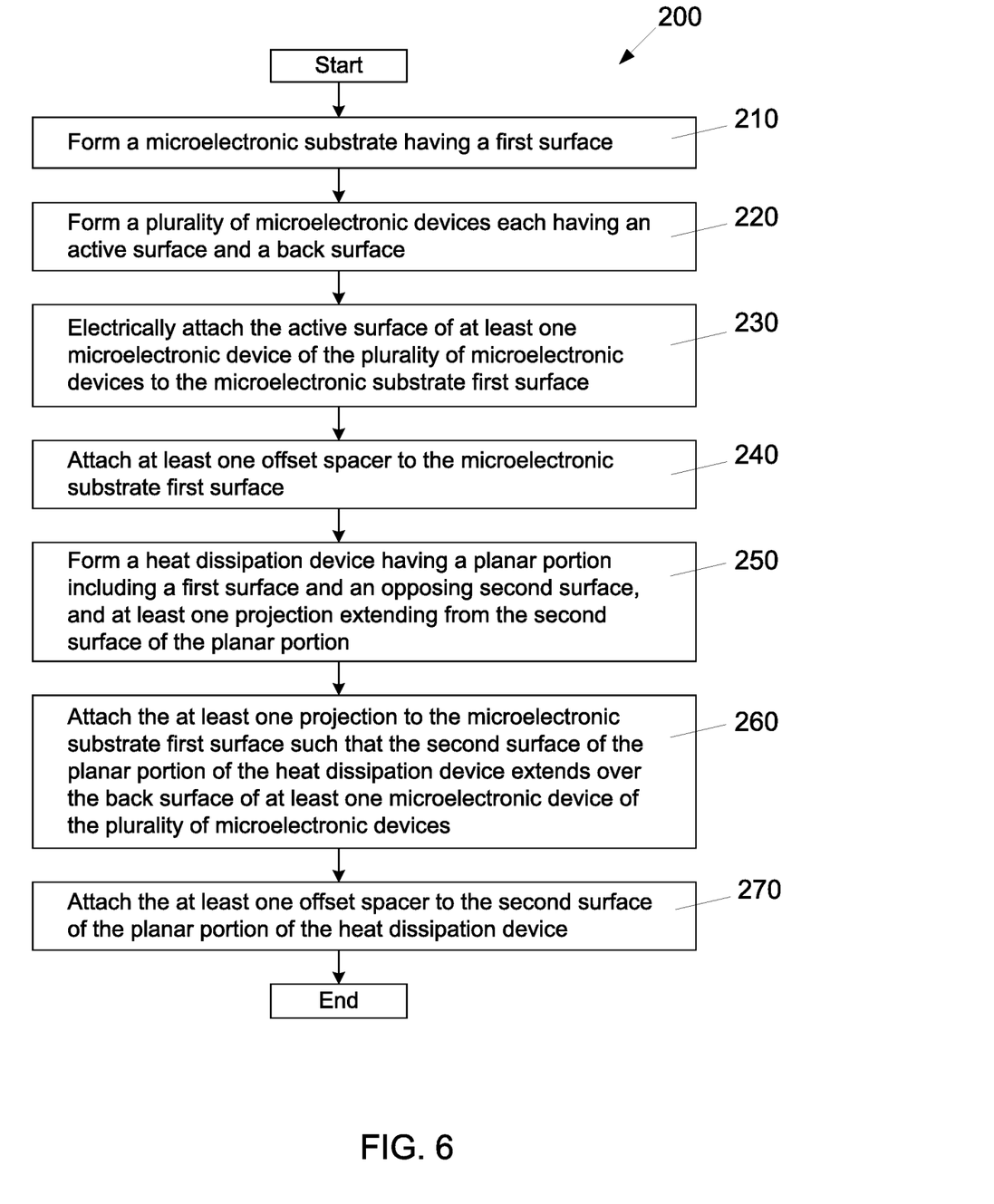
FIG. 6 is a flow chart of a process of fabricating a microelectronic package including offset spacer(s), according to an embodiment of the present description.

FIG. 6 is a flow chart of a process 200 of fabricating a microelectronic package according to the various embodiments of the present description. As set forth in block 210, a microelectronic substrate having a first surface may be formed. A plurality of microelectronic devices having an active surface and a back surface may be formed, as set forth in block 220. As set forth in block 230, the active surface of at least one microelectronic device of the plurality of microelectronic devices may be electrically attached to the microelectronic substrate first surface. At least one offset spacer may be attached to the microelectronic substrate first surface, as set forth in block 240. As set forth in block 250, a heat dissipation device may be formed having a planar portion including a first surface and an opposing second surface, and at least one projection extending from the second surface of the portion. The at least one projection may be attached to the microelectronic substrate first surface such that the second surface of the planar portion of the heat dissipation device extends over the back surface of at least one microelectronic device of the plurality of microelectronic devices, as set forth in block 260. As defined in block 270, the at least one offset spacer may be attached to the second surface of the planar portion of the heat dissipation device.

Figure 7:
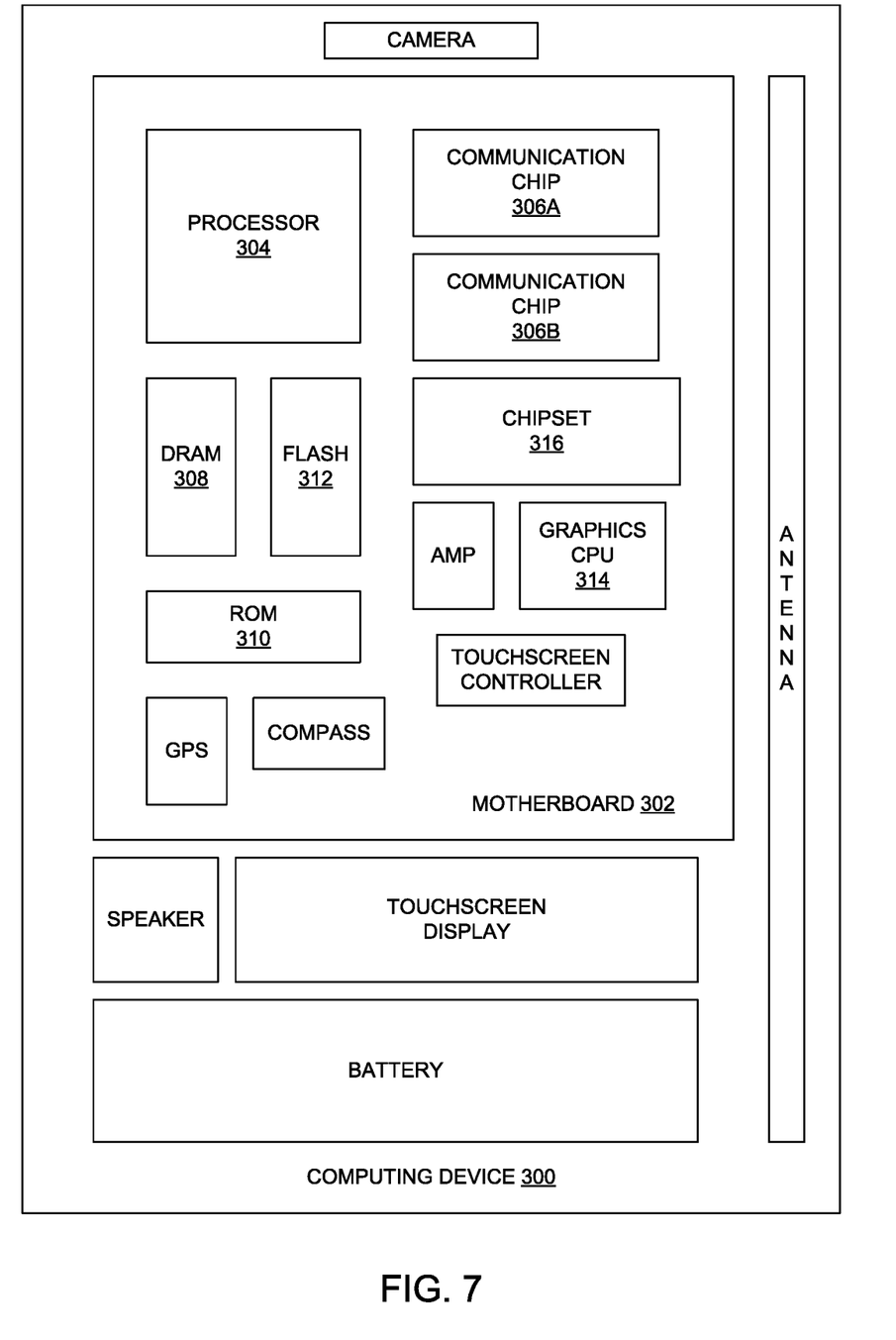
FIG. 7 illustrates an electronic system, according to one embodiment of the present description.

FIG. 7 illustrates a computing device 300 in accordance with one implementation of the present description. The computing device 300 may house a board 302. The board 302 may include a number of microelectronic components attached thereto, including but not limited to a processor 304, at least one communication chip 306A, 306B, volatile memory 308, (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the microelectronic components may be physically and electrically coupled to the board 302. In some implementations, at least one of the microelectronic components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others The term "processor" may refer to any device or portion of a device that processes electronic data from registers and/or memory to transform that electronic data into other electronic data that may be stored in registers and/or memory.

Any of the microelectronic components within the computing device 300 may include a microelectronic package including a plurality of microelectronic devices attached to a microelectronic substrate, a heat dissipation device in thermal contact with at least one of the plurality of microelectronic devices and attached to the microelectronic substrate, and at least one offset spacer attached between the microelectronic substrate and the heat dissipation device to control the bondline thickness between the heat dissipation device and at least one of the plurality of microelectronic devices.

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-7. The subject matter may be applied to other microelectronic device and assembly applications, as will be understood to those skilled in the art.

The following examples pertain to further embodiments, wherein Example 1 is a microelectronic package comprising a microelectronic substrate having a first surface; a plurality of microelectronic devices each having an active surface and a back surface, wherein the microelectronic device active surface of at least one microelectronic device of the plurality of microelectronic devices is electrically attached to the microelectronic substrate first surface; a heat dissipation device, including a planar portion having a first surface and an opposing second surface, and at least one projection extending from the second surface of planar portion, wherein the at least one projection is attached to the microelectronic substrate and wherein the second surface of the planar portion of the heat dissipation device is in thermal contact with the back surface of at least one microelectronic device of the plurality of microelectronic devices; and at least one offset spacer attached to the second surface of the planar portion of the heat dissipation device and attached to the microelectronic substrate.

In Example 2, the subject matter of Example 1 can optionally include the at least one offset spacer comprising a column.

In Example 3, the subject matter of Example 1 can optionally include the at least one offset spacer comprising a wall.

In Example 4, the subject matter of any of Examples 1 to 3 can optionally include the at least one offset spacer including a first attachment surface and an opposing second attachment surface, wherein the at least one offset spacer is attached to the microelectronic substrate with a first adhesive material disposed between the at least one offset spacer first attachment surface and the microelectronic substrate first surface, and wherein the at least one offset spacer is attached to the heat dissipation device with a second adhesive material disposed between the offset spacer second attachment surface and the planar portion second surface of the heat dissipation device.

In Example 5, the subject matter of Example 4 can optionally include a distance from the microelectronic substrate first surface and the offset spacer second attachment surface being greater than distances from microelectronic substrate first surface and the back surfaces of the plurality of microelectronic devices.

In Example 6, the subject matter of Example 5 can optionally include a thermal interface material disposed between the second surface of the planar portion of the heat dissipation device and the back surface of at least one microelectronic device of the plurality of microelectronic devices.

In Example 7, the subject matter of any of Examples 1 to 6 can optionally include an underfill material disposed between the microelectronic device active surface and the microelectronic substrate first surface.

In Example 8, the subject matter of any of Examples 1 to 7 can optionally include the at least one offset spacer comprising a substantially rigid material.

In Example 9, the subject matter of Example 8 can optionally include the substantially rigid material being selected from the group consisting of steel, aluminum, copper, and ceramic materials.

The following examples pertain to further embodiments, wherein Example 10 is a method of fabricating a microelectronic package, comprising forming a microelectronic substrate having a first surface; forming a plurality of microelectronic devices each having an active surface and a back surface; electrically attaching the active surface of at least one microelectronic device of the plurality of microelectronic devices to the microelectronic substrate first surface; attaching at least one offset spacer to the microelectronic substrate first surface; forming a heat dissipation device having a planar portion including a first surface and an opposing second surface, and at least one projection extending from the second surface of the planar portion; attaching the at least one projection to the microelectronic substrate first surface such that the second surface of the planar portion of the heat dissipation device extends over the back surface of at least one microelectronic device of the plurality of microelectronic devices; and attaching the at least one offset spacer to the second surface of the planar portion of the heat dissipation device.

In Example 11, the subject matter of Example 10 can optionally include attaching at least one offset spacer to the microelectronic substrate first surface comprising attaching at least one column shaped offset spacer to the microelectronic substrate first surface.

In Example 12, the subject matter of Example 10 can optionally include attaching at least one offset spacer to the microelectronic substrate first surface comprising attaching at least one wall shaped offset spacer to the microelectronic substrate first surface.

In Example 13, the subject matter of any of Examples 10 to 12 can optionally include the at least one offset spacer includes a first attachment surface and an opposing second attachment surface, wherein attaching the at least one offset spacer to the microelectronic substrate comprises attaching the at least one offset spacer to the microelectronic substrate with a first adhesive material disposed between the at least one offset spacer first attachment surface and the microelectronic substrate first surface, and wherein attaching the at least one offset spacer to the heat dissipation device comprises attaching the at least one offset spacer to the heat dissipation device with a second adhesive material disposed between the offset spacer second attachment surface and the planar portion second surface of the heat dissipation device.

In Example 14, the subject matter of Example 13 can optionally include a distance from the microelectronic substrate first surface and the offset spacer second attachment surface is greater than distances from microelectronic substrate first surface and the back surfaces of the plurality of microelectronic devices.

In Example 15, the subject matter of any of Examples 10 to 14 can optionally include disposing a thermal interface material between the second surface of the planar portion of the heat dissipation device and the back surface of at least one microelectronic device of the plurality of microelectronic devices.

In Example 16, the subject matter of any of Examples 10 to 15 can optionally include disposing an underfill material between the microelectronic device active surface and the microelectronic substrate first surface.

The following examples pertain to further embodiments, wherein Example 17 is an electronic system, comprising a board; and a microelectronic package attached to the board, wherein the microelectronic package includes a microelectronic substrate having a first surface; a plurality of microelectronic devices each having an active surface and a back surface, wherein the microelectronic device active surface of at least one microelectronic device of the plurality of microelectronic devices is electrically attached to the microelectronic substrate first surface; a heat dissipation device, including a planar portion having a first surface and an opposing second surface, and at least one projection extending from the second surface of planar portion, wherein the at least one projection is attached to the microelectronic substrate and wherein the second surface of the planar portion of the heat dissipation device is in thermal contact with the back surface of at least one microelectronic device of the plurality of microelectronic devices; and at least one offset spacer attached to the second surface of the planar portion of the heat dissipation device and attached to the microelectronic substrate.

In Example 18, the subject matter of Example 17 can optionally include the at least one offset spacer comprising a column.

In Example 19, the subject matter of Example 17 can optionally include the at least one offset spacer comprising a wall.

In Example 20, the subject matter of any of Examples 17 to 19 can optionally include the at least one offset spacer including a first attachment surface and an opposing second attachment surface, wherein the at least one offset spacer is attached to the microelectronic substrate with a first adhesive material disposed between the at least one offset spacer first attachment surface and the microelectronic substrate first surface, and wherein the at least one offset spacer is attached to the heat dissipation device with a second adhesive material disposed between the offset spacer second attachment surface and the planar portion second surface of the heat dissipation device.

In Example 21, the subject matter of Example 20 can optionally include a distance from the microelectronic substrate first surface and the offset spacer second attachment surface being greater than distances from microelectronic substrate first surface and the back surfaces of the plurality of microelectronic devices.

In Example 22, the subject matter of Example 21 can optionally include a thermal interface material disposed between the second surface of the planar portion of the heat dissipation device and the back surface of at least one microelectronic device of the plurality of microelectronic devices.

In Example 23, the subject matter of any of Examples 17 to 22 can optionally include an underfill material disposed between the microelectronic device active surface and the microelectronic substrate first surface.

In Example 24, the subject matter of any of Examples 17 to 23 can optionally include the at least one offset spacer comprising a substantially rigid material.

In Example 25, the subject matter of Example 24 can optionally include the substantially rigid material being selected from the group consisting of steel, aluminum, copper, and ceramic materials.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A microelectronic package, comprising:
   a microelectronic substrate having a first surface;
   a plurality of microelectronic devices each having an active surface and a back surface, wherein the microelectronic device active surface of at least one microelectronic device of the plurality of microelectronic devices is electrically attached to the microelectronic substrate first surface;
   a heat dissipation device, including a planar portion having a first surface and an opposing second surface, and at least one projection extending from the second surface of planar portion, wherein the at least one projection is attached to the microelectronic substrate, wherein the second surface of the planar portion of the heat dissipation device is in thermal contact with the back surface of at least one microelectronic device of the plurality of microelectronic devices, and wherein the planar portion and the at least one projection comprise a single continuous material; and
   at least one offset spacer attached to the second surface of the planar portion of the heat dissipation device and attached to the microelectronic substrate, wherein the at least one offset spacer includes a first attachment surface and an opposing second attachment surface, wherein the at least one offset spacer is attached to the microelectronic substrate with a first adhesive material disposed between the at least one offset spacer first attachment surface and the microelectronic substrate first surface, wherein the at least one offset spacer is attached to the heat dissipation device with a second adhesive material disposed between the offset spacer second attachment surface and the planar portion second surface of the heat dissipation device, wherein the at least one offset spacer comprises a wall, wherein at least a portion of the at least one offset spacer extends between a first microelectronic device of the plurality of microelectronic devices and a second microelectronic device of the plurality of microelectronic devices, and wherein another portion of the at least one offset spacer does not reside between the first microelectronic device of the plurality of microelectronic devices and the second microelectronic device of the plurality of microelectronic devices.

2. The microelectronic package of claim 1, wherein a distance from the microelectronic substrate first surface and the offset spacer second attachment surface is greater than distances from the microelectronic substrate first surface and the back surfaces of the plurality of microelectronic devices.

3. The microelectronic package of claim 1, further including a thermal interface material disposed between the second surface of the planar portion of the heat dissipation device and the back surface of at least one microelectronic device of the plurality of microelectronic devices.

4. The microelectronic package of claim 1, further including an underfill material disposed between the microelectronic device active surface and the microelectronic substrate first surface.

5. The microelectronic package of claim 1, wherein the at least one offset spacer comprises a substantially rigid material.

6. The microelectronic package of claim 5, wherein the substantially rigid material is selected from the group consisting of steel, aluminum, copper, and ceramic materials.

7. The microelectronic package of claim 1, wherein the at least one offset spacer comprises an L-shaped wall.

8. The microelectronic package of claim 1, wherein the at least one offset spacer comprises an H-frame.

9. A method of fabricating a microelectronic package, comprising:
   forming a microelectronic substrate having a first surface;
   forming a plurality of microelectronic devices each having an active surface and a back surface;
   electrically attaching the active surface of at least one microelectronic device of the plurality of microelectronic devices to the microelectronic substrate first surface;
   attaching a first attachment surface of at least one offset spacer to the microelectronic substrate first surface with a first adhesive material disposed between the at least one offset spacer first attachment surface and the microelectronic substrate first surface, wherein the at least one offset spacer comprises a wall, wherein at least a portion of the at least one offset spacer extends between a first microelectronic device of the plurality of microelectronic devices and a second microelectronic device of the plurality of microelectronic devices, and wherein another portion of the at least one offset spacer does not reside between the first microelectronic device of the plurality of microelectronic devices and the second microelectronic device of the plurality of microelectronic devices;
   forming a heat dissipation device having a planar portion including a first surface and an opposing second surface, and at least one projection extending from the second surface of the planar portion, wherein the planar portion and the at least one projection comprise a single continuous material;
   attaching the at least one projection to the microelectronic substrate first surface such that the second surface of the planar portion of the heat dissipation device extends over the back surface of at least one microelectronic device of the plurality of microelectronic devices; and
   attaching a second attachment surface of the at least one offset spacer to the second surface of the planar portion of the heat dissipation device with a second adhesive material disposed between the offset spacer second attachment surface and the planar portion second surface of the heat dissipation device.

10. The method of claim 9, wherein a distance from the microelectronic substrate first surface and the offset spacer second attachment surface is greater than distances from the microelectronic substrate first surface and the back surfaces of the plurality of microelectronic devices.

11. The method of claim 9, further including disposing a thermal interface material between the second surface of the planar portion of the heat dissipation device and the back surface of at least one microelectronic device of the plurality of microelectronic devices.

12. The method of claim 9, further including disposing an underfill material between the microelectronic device active surface and the microelectronic substrate first surface.

13. The method of claim 9, wherein the at least one offset spacer comprises an L-shaped wall.

14. The method of claim 9, wherein the at least one offset spacer comprises an H-frame.

15. An electronic system, comprising:
   a board; and
   a microelectronic package attached to the board, wherein the microelectronic package includes:
      a microelectronic substrate having a first surface;
      a plurality of microelectronic devices each having an active surface and a back surface, wherein the microelectronic device active surface of at least one microelectronic device of the plurality of microelectronic devices is electrically attached to the microelectronic substrate first surface;
      a heat dissipation device, including a planar portion having a first surface and an opposing second surface, and at least one projection extending from the second surface of the planar portion, wherein the at least one projection is attached to the microelectronic substrate, wherein the second surface of the planar portion of the heat dissipation device is in thermal contact with the back surface of at least one microelectronic device of the plurality of microelectronic devices, and wherein the planar portion and the at least one projection comprise a single continuous material; and
      at least one offset spacer attached to the second surface of the planar portion of the heat dissipation device and attached to the microelectronic substrate, wherein the at least one offset spacer includes a first attachment surface and an opposing second attachment surface, wherein the at least one offset spacer is attached to the microelectronic substrate with a first adhesive material disposed between the at least one offset spacer first attachment surface and the microelectronic substrate first surface, and wherein the at least one offset spacer is attached to the heat dissipation device with a second adhesive material disposed between the offset spacer second attachment surface and the planar portion second surface of the heat dissipation device, wherein the at least one offset spacer comprises a wall, wherein at least a portion of the at least one offset spacer extends between a first microelectronic device of the plurality of microelectronic devices and a second microelectronic device of the plurality of microelectronic devices, and wherein another portion of the at least one offset spacer does not reside between the first microelectronic device of the plurality of microelectronic devices and the second microelectronic device of the plurality of microelectronic devices.

16. The electronic system of claim 15, wherein a distance from the microelectronic substrate first surface and the offset spacer second attachment surface is greater than distances from the microelectronic substrate first surface and the back surfaces of the plurality of microelectronic devices.

17. The electronic system of claim 15, further including a thermal interface material disposed between the second surface of the planar portion of the heat dissipation device and the back surface of at least one microelectronic device of the plurality of microelectronic devices.

18. The electronic system of claim 15, further including an underfill material disposed between the microelectronic device active surface and the microelectronic substrate first surface.

19. The electronic system of claim 15, wherein the at least one offset spacer comprises a substantially rigid material.

20. The electronic system of claim 19, wherein the substantially rigid material is selected from the group consisting of steel, aluminum, copper, and ceramic materials.

21. The electronic system of claim 15, wherein the at least one offset spacer comprises an L-shaped wall.

22. The electronic system of claim 15, wherein the at least one offset spacer comprises an H-frame.

* * * * *